United States Patent [19]

Degelormo et al.

[11] Patent Number: 5,242,859
[45] Date of Patent: Sep. 7, 1993

[54] HIGHLY DOPED SEMICONDUCTOR MATERIAL AND METHOD OF FABRICATION THEREOF

[75] Inventors: Joseph F. Degelormo, Cold Spring; Paul M. Fahey, Pleasantville; Thomas N. Jackson, Peekskill; Craig M. Ransom, Hopewell Junction; Devendra K. Sadana, Pleasantville, all of N.Y.

[73] Assignee: International Business Machines Corporation, Armonk, N.Y.

[21] Appl. No.: 913,560

[22] Filed: Jul. 14, 1992

[51] Int. Cl.⁵ .................. H01L 21/223; H01L 21/383
[52] U.S. Cl. .................. 437/165; 437/141; 437/146; 437/153; 148/DIG. 30
[58] Field of Search ............... 437/165, 141, 146, 153; 148/DIG. 30

[56] References Cited

U.S. PATENT DOCUMENTS

| | | | |
|---|---|---|---|
| 2,930,950 | 3/1960 | Teszner . | |
| 3,442,725 | 5/1969 | Huffman et al. . | |
| 3,812,519 | 5/1974 | Nakamura et al. | 437/953 |
| 3,949,119 | 4/1976 | Shewchun et al. | 437/106 |
| 4,157,269 | 5/1979 | Ning et al. | 437/190 |
| 4,178,224 | 12/1979 | Porter | 204/237 |
| 4,348,428 | 9/1982 | Rockley et al. | 437/88 |
| 4,492,008 | 1/1985 | Anantha et al. | 437/54 |
| 4,721,683 | 1/1988 | Ward | 437/20 |
| 4,792,837 | 12/1988 | Zazzu | 257/507 |
| 4,861,729 | 8/1989 | Fuse et al. | 437/165 |
| 4,904,616 | 2/1990 | Bohling et al. | 437/133 |
| 4,936,877 | 6/1990 | Hultquist et al. | 55/16 |
| 4,939,103 | 7/1990 | Szolgyemy | 437/165 |
| 4,988,640 | 1/1991 | Bohling et al. | 437/233 |
| 5,004,821 | 4/1991 | Hofmann | 556/70 |
| 5,017,990 | 5/1991 | Chen et al. | 257/586 |

OTHER PUBLICATIONS

T. Sakurai et al., "Effects of Atmosphere During Arsenic Diffusion in Silicon from Doped Oxide", Appl. Phys. Lett., vol. 22, No. 5, Mar. 1, 1972, pp. 219-220.

Y. Tsunoda, "Effect of Atmosphere on Arsenic Diffusion in Silicon", Japan J. Appl. Phys., vol. 13, (1974), No. 11, pp. 1901-1902.

J. Murota et al., "Arsenic Diffusion in Silicon from Doped Polycrystalline Silicon", Japan. J. Appl. Phys., vol. 17, (1978), No. 2, pp. 457-458.

(List continued on next page.)

Primary Examiner—Brian E. Hearn
Assistant Examiner—Trung Dane
Attorney, Agent, or Firm—Daniel P. Morris

[57] ABSTRACT

A method is provided for diffusion doping of semiconductor chips and wafers, in particular silicon chips and wafers, at peak concentrations of greater than about $3 \times 10^{19}$ atoms/cm³. The semiconducting material to be doped is placed in a furnace wherein the furnace contains an atmosphere of a carrier gas and a dopant containing gas. The doping containing gas is greater than about 0.1 volume percent of the total volume in the furnace chamber. The pressure of the composite gas is greater than about 0.1 Torr. The composite gas has an oxidizing agent concentration of less than about 1 part per million. The method permits the direct doping of a silicon surface to form a shallow n-doped region having a high peak concentration by a diffusion process thereby eliminating damage to the silicon surface from ion implantation which is the commonly used method to achieve these high doping concentrations. Since the method is nondirectional trench sidewalls can be doped at high concentrations.

24 Claims, 4 Drawing Sheets

OTHER PUBLICATIONS

T. Budzynski et al., "The Chemically Deposited Layers as a Diffusion Source in Microelect.", Electron Technology, 22, 1/4, pp. 55–62, Institute of Electron Technology, Warszawa, 1990.

J. S. Sandhu et al., "Arsenic Source Vapor Pressure Kinetics and Capsule Diffusion", IBM J. Res. Develop., Nov. 1971, pp. 464–471.

W. J. Armstrong, "The Diffusivity of Arsenic in Silicon", Journal of the Electrochemical Society, Nov. 1962, vol. 109, No. 11, pp. 1065–1067.

S. K. Ghandhi, "VLSI Fabrication Principles", p. 170, John Wiley & Sons.

Y. W. Hsueh, "Arsenic Diffusion in Silicon Using Arsine", Electrochemical Technology, Sep.–Oct., 1968, vol. 6, No. 9–10, pp. 361–365.

T. Inoue et al., "80PS 30000Gates ECL Gate Array E-30000VH", 1989 BCTM, pp. 15–16.

K-Y Toh, "High-Speed Digital Circuits", 1989 IEEE Int'l. Solid-State Circuits Conference, Feb. 17, 1989, pp. 224–225.

J. E. Brighton et al., "Scaling Issues in the Evolution of EXCL Bipolar Technology", IEEE 1988 Bipolar Circuits & Tech. Meeting, pp. 121–123.

T. H. Ning et al., "Self-Aligned NPN Bipolar Transistors", p. 823.

HIGHLY DOPED SEMICONDUCTOR MATERIAL AND METHOD OF FABRICATION THEREOF

FIELD OF THE INVENTION

This invention relates to methods of diffusing impurities of very high peak concentration into preselected regions of a body of semiconductor material. More particularly, the present invention relates to diffusing n-doped regions of high peak concentration to form source and drain regions for FET transistors and n-doped emitters and subcollectors for bipolar transistors in a wafer of semiconducting material. More particularly, the invention describes uniform doping of trench structures and achieving high conductivity polycrystalline Si with sheet resistances of $\leq 25\Omega/\square$. More particularly, the source of the dopant is dopant containing gas. More particularly, the peak concentration is greater than about $3 \times 10^{19}$ atoms/cm$^3$. Most particularly, the high peak concentration is achieved by controlling the pressure and composition of a mixture of the doping source gas and a carrier gas and minimizing the presence of oxidizing agents.

BACKGROUND OF THE INVENTION

In making silicon integrated circuits, many process steps require selective doping of a silicon substrate with high concentrations of p and n-doping material, such as boron and arsenic. Additionally, it is necessary to control the depth of penetration of the dopant. Ion implantation is the dominant technique in use today to achieve dopant profiles of high peak concentration and shallow depth. However, the implantation process, by its nature, damages the semiconductor substrate. This implantation damage has proven to be a performance and yield-limiting factor in silicon ICs and is a serious problem which influences the choice of a particular silicon IC fabrication process. In addition, ion implantation cannot be easily used in some non-planar processes, for example, to dope the sidewalls of trenches. To avoid implant damage and satisfy nonplanar doping requirements, various techniques have been proposed to outdiffuse the dopant from some grown or deposited material into a wafer of semiconducting material such as silicon. These processes typically suffer from one or more of the following problems, they are not highly reproducible, they are not clean and they do not introduce a high enough surface concentration of dopant, the source is eventually depleted.

There are numerous known methods for diffusing n-dopants into semiconductor wafers.

W. Runyan in "Silicon Semiconductor Technology", McGraw Hill, N.Y., 1965, describes arsenic diffusion using a solid source is usually performed from the reaction of arsenic trioxide and silicon. Vapors of the oxide are transported into the diffusion zone of a diffusion furnace by a mixture of nitrogen and $\leq 0.5\%$ oxygen. The oxygen is added to prevent staining caused by the formation of an arsenic layer at the oxide-silicon interface. Surface concentrations obtained by this technique do not exceed $(2-3) \times 10^{19}$ cm$^{-3}$, because of rapid depletion of the arsenic by evaporation from the silicon surface.

S. K. Gandhi, in "VLSI Fabrication Principles", John Wiley & Sons, 1983, pp 170-171 describes the use of spin-on dopants have with arsenic which consists of the arseno-siloxanes in an appropriate organic binder. Upon bake out at 250° C., these react to form an arsenosilicate glass which acts as the source of this dopant. Higher doping concentration can be achieved by this method, since the glass serves as an evaporation barrier to the arsenic during diffusion. However, this process is inherently dirty because of the organic materials and glasses used, and is not suitable for the state-of-the-art semiconductor IC fabrication.

S. K. Gandhi, in "VLSI Fabrication Principles", John Wiley & Sons, 1983, pp 170-171 describes the use of sealed-tube technology has also been used successfully for arsenic diffusion. Here silicon slices and a solid arsenic source are sealed in a evacuated quartz tube. The arsenic source is typically silicon powder doped with arsenic to a concentration of about 3%. Surface concentrations of as high as $10^{21}$ cm$^{-3}$ are achieved. However, the requirements of a sealed tube and limited source of As make the technique unsuitable for high volume silicon IC fabrication.

Y. W. Hsueh, J. Electrochemical Society, Vol. 6, 361-65, 1968 describes gaseous systems using arsine for arsenic diffusion into silicon. The diffusion was conducted in the temperature range of 1164°-1280° C. When hydrogen or nitrogen was used as the carrier gas, heavy pitting of the silicon surface was observed. This resulted in nonuniform and erratic sheet resistance on a silicon wafer. In order to avoid the pitting, a small amount of oxygen was mixed with arsine for arsenic diffusion. Although, the pitting was reduced, surface concentrations of only $\leq 2 \times 10^{19}$ cm$^{-3}$ were achieved.

In U.S. Pat. No. 3,812,519, to Nakamura et al. also utilized silicon doping via a gaseous source. In their experiments, a silicon semiconductor device is double doped with phosphorus and arsenic or boron and arsenic wherein the arsenic is present in an amount 3 to 40% of the other dopant. The method of the Nakamura et al. requires that, to achieve a high doping concentration, more than one species be added to the silicon semiconductor device.

Ion implantation, which is the presently used method to achieve very high doping levels, is unidirectional. Therefore, using ion implantation it is difficult to dope the sidewall of a trench.

The article entitled "Doping of Trench Capacitors by Rapid Thermal Diffusion", W. Zagozdzon-Wosik et al., IEEE, Electron Device Letters, Vol. 12, 264 (1991) shows doping of trench sidewalls. According to the method of this article, a doped glass is first spun onto a separate wafer. Then the wafer to be doped is placed in proximity to the glass-doped wafer and heated to allow evaporation of As-containing gas. This is simply a variation of other solid source techniques experimented with in the past. Their drawbacks are: the solid source is eventually depleted; the doping is sensitive to the spacing between the wafers and the source; they are not particularly clean; and one solid source is required for each wafer to be doped, which decreases throughput.

The article entitled "Laser Doping of Semiconductors" in "Laser Processes for Microelectronics Applications", 1988 (Electrochemical Society, Pennington, N.J., 1988), T. W. Sigmon describes a method requiring melting the silicon at the surface with a laser in order to incorporate As from AsH$_3$ gas. The level and depth of As incorporation are determined by a variety of parameters related to the laser optics and laser operating conditions. The technique requires selective melting of the silicon in the area where the dopant is too be incorporated, and scanning across the wafer incrementally since the beam size is much smaller than the wafer diameter.

SUMMARY OF THE INVENTION

An object of the present invention is to provide a method for diffusing an n-dopant from the gas phase into a semiconductor substrate at a peak concentration greater than about $3 \times 10^{19}$ cm$^{-3}$.

Another object of the present invention is to provide a method of diffuse a particular species of n-dopant into a semiconductor substrate without simultaneously diffusing a different dopant species into the substrate.

A further object of the present invention is to provide a method to diffusion dope the sidewall of a trench on a semiconductor substrate at dopant concentrations greater than about $3 \times 10^{19}$ cm$^{-3}$.

An additional object of the present invention is to provide a method to diffusion dope a semiconductor substrate without using a solid source which must be placed in close proximity with the semiconductor substrate.

Yet another object of the present invention is to provide a method to diffusion dope a semiconductor substrate without oxidizing treatment of the substrate surface.

In its broadest aspect, the present invention is a method for diffusing a dopant into a semiconductor workpiece, such as a semiconductor wafer, to form a region having a peak concentration in excess of $3 \times 10^{19}$ atoms/cm$^3$.

In a more particular aspect of the present invention, the dopant is diffused from a gas containing a dopant containing constituent in a carrier gas substantially free of oxidizing agents.

In another more particular aspect of the present invention, the gas contains a single doping species.

In another more particular aspect of the present invention, the gas contains greater than about 0.1% volume percent of the dopant containing constituent.

In another more particular aspect of the present invention, the pressure of the gas is greater than about 0.1 Torr.

In another more particular aspect of the present invention the oxidizing agents are present at concentrations less than about 1 part per million.

BRIEF DESCRIPTION OF THE DRAWINGS

These and other objects, features and advantages of the present invention will become apparent upon a consideration of the following detailed description of the invention when read in conjunction with drawing Figures, in which.

DETAILED DESCRIPTION

Figure 1:
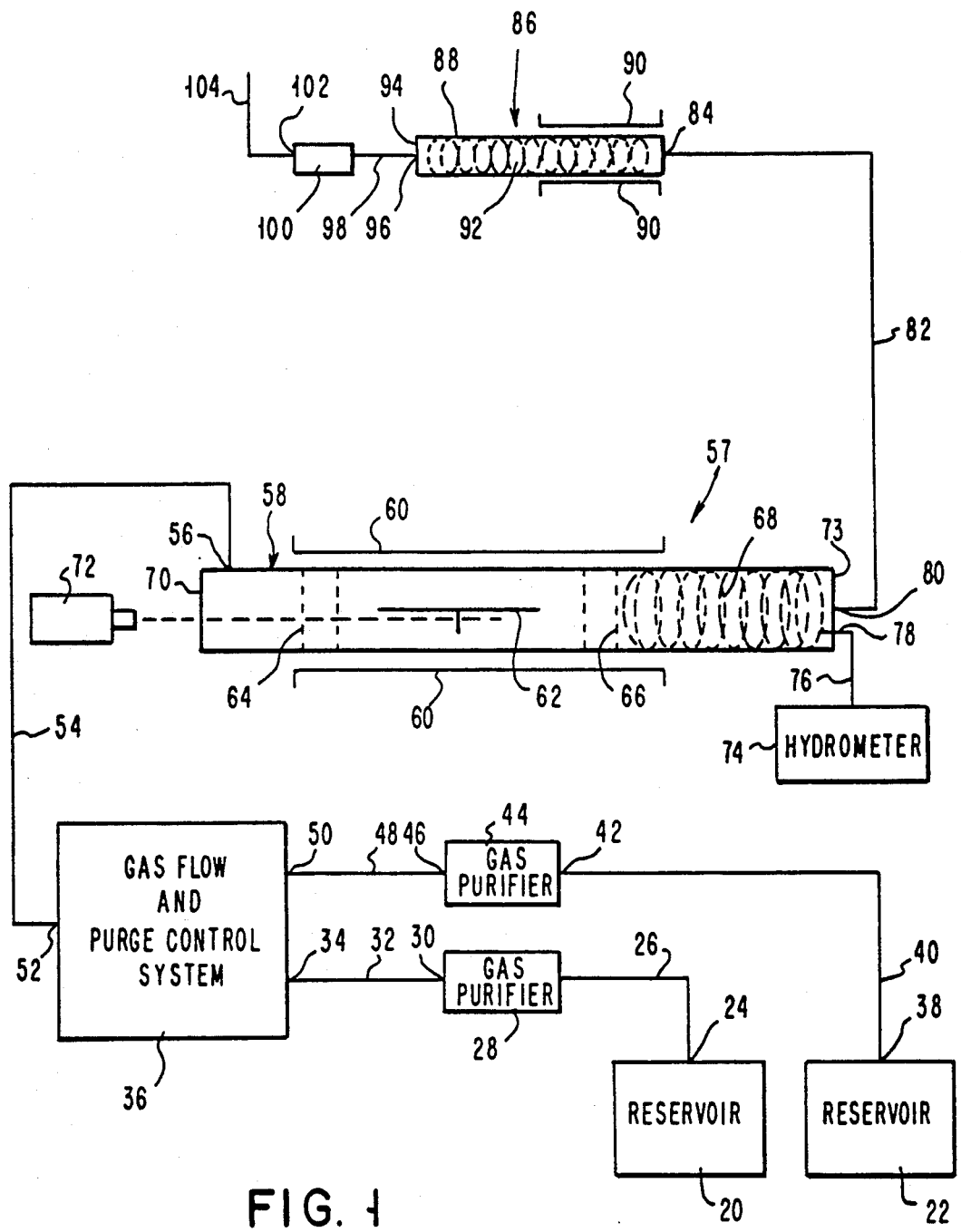
FIG. 1 shows a schematic diagram of a typical diffusion doping apparatus to achieve the high doping levels of the present invention.

FIG. 1 is a schematic diagram of a doping system useful to practice the present invention. A carrier gas is provided by reservoir 20, such as a tank of helium, argon, or nitrogen. The source of the doping material is provided by reservoir 22 which for arsenic doping can be a tank of arsine, tertiarybutylarsine, trimethylarsine or similar arsenic containing material. Output 24 of reservoir 20 is fed by gas line 26 to a gas purifier 28 such as a lithium base gas purifier manufactured by Advanced Technology Materials, Danbury, Conn. Output 30 of purifier 28 is fed by gas line 32 into input 34 of a gas flow and purge control system 36. Output 38 of reservoir 22 is fed by gas line 40 to input 42 of gas purifier 44 which can be the same type purifier as purifier 28. Output 46 of gas purifier 44 is fed by gas line 48 to gas and purge control 36. The gas flow and purge control 36 combine the carrier gas at input 34 and the doping source gas at input 50. The output gas from output 54 of gas flow purge control 36 is a combination of the carrier gas and the doping gas. Output 52 of the gas flow purge control 36 is connected by gas line 54 to input 56 of furnace 57. Heating element 60 surrounds the central region of furnace tube 58. At the interior of furnace tube 58 there is a workpiece holder 62 which can be made of graphite. Workpiece holder 62 can be heated, for example, to raise the temperature of the workpiece. On either side of the workpiece holder 62 there are convection stops 64 and 66. These convection stops are made of quartz plates with holes in them. To the right of the convection stop 66 there is a trap 68. Trap 68 can be quartz wool. Trap 68 is to trap the active dopant species which is in the gas stream. At end 70 of the furnace 58 there is a pyrometer 72 for monitoring the temperature of the workpiece holder. At end 72 of the furnace tube 58 there is a hydrometer 74 which is connected to furnace tube 58 by gas tube 76 which connects to output 78 on end 58 of furnace tube 58. The hydrometer monitors the humidity on the interior of the furnace tube 58. At end 72 of furnace tube 58 there is an exhaust output 80 which is connected by gas tube 82 to input 84 of pyrolysis furnace 86 which is composed of a furnace tube 88. At least a part of furnace tube 88 is surrounded by a heating element 90. On the interior of the pyrolysis furnace there is an active species trap 92 such as quartz wool. The pyrolysis furnace 86 is to collect the remaining active species in the output gas from the furnace 58 so that it is not exhausted to the atmosphere. At end 94 of the pyrolysis furnace 86 there is an output 96 which is connected by gas tube 98 to filter 100. From filter 100 there is an exit port 102 from which the remaining gas is exhausted through tube 104 to the atmosphere.

The method of the invention will be further described with reference to n-type doping which is the preferred embodiment. Those skilled in the art will recognize its applicability to p-type dopant for example using diborane or other p-type dopant containing materials as the gas source of p-type dopant. To circumvent the problems described above, in regard to other methods to achieve high doping levels, we propose that n-doping of a semiconductor such as silicon, can be accomplished by gas-phase doping if the concentration of the dopant, such as arsenic, in the gas is sufficiently high and the concentration of oxidant is sufficiently low. This method involves heating the wafer in a furnace, such as furnace 59 of FIG. 1, and introducing a gas containing a carrier gas and a gas of a constituent containing the dopant. The gas of the constituent containing the dopant is at a high partial pressure and diluted in a suitable carrier gas such as helium. In our experiments, we have successfully used, for example, arsine (AsH$_3$) gas as a source of arsenic at concentrations much higher than those normally used in the silicon integrated circuit industry. As-containing gasses such as tertiarybutylarsine, trimethylarsenic, or triethylarsenic can also be used. In addition, introducing small amounts of oxygen to the carrier gas and dopant source gas may change the indiffusion mechanism by forming an As-rich glass on the semiconductor surface such as a silicon surface.

Figure 2:
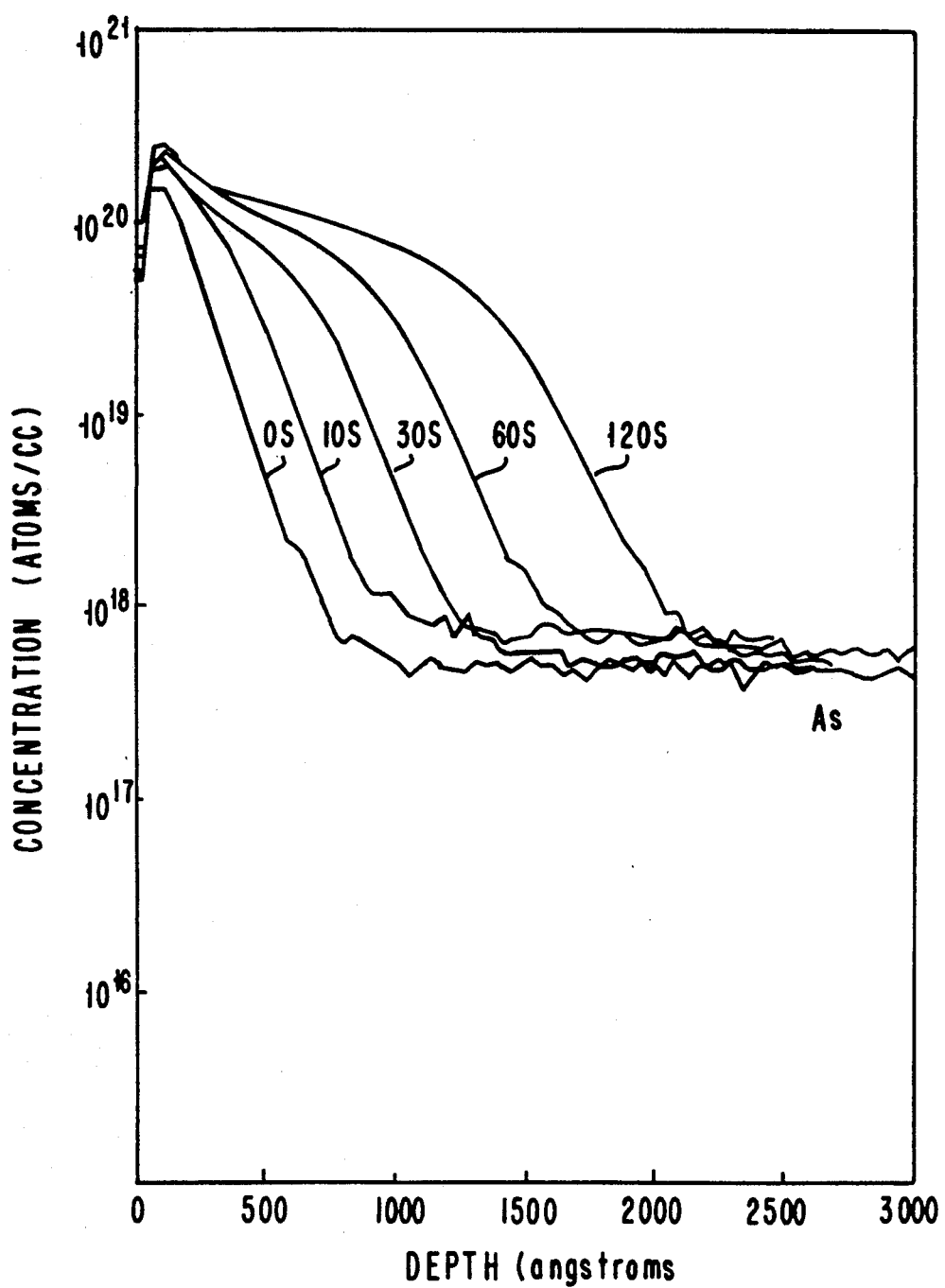
FIG. 2 shows the arsenic doping profile for arsenic diffused at 1100° C. for 0, 10, 30, 60 and 120 seconds.

FIG. 2 shows As-doping profiles in silicon at 1100° C. for 0, 10, 30, 60 and 120 seconds wherein the 1100° C. is the temperature measured by pyrometer 72 of FIG. 1 and wherein the time is the time the silicon wafers are in furnace 59 of FIG. 1. From this data it appears that the technique, according to the present invention functions as an ideal diffusion source. The surface concentration of the As at the surface of the silicon wafer is determined by the solubility of the As at the diffusion temperature and the penetration depth is determined by the equilibrium diffusion rate of the As in silicon at the diffusion temperature. The technique of the present invention solves all of the afore mentioned problems; (1) the amount of As diffusion to the silicon is controlled only by the temperature and time of the process, which are the easiest process parameters to control; (2) no damage is introduced into the silicon; (3) the process is very clean because the gases are very clean; and (4) the process is easily applied to nonplanar surfaces because any surface exposed to the arsenic containing gas will allow dopants to diffuse into it.

Figure 3:
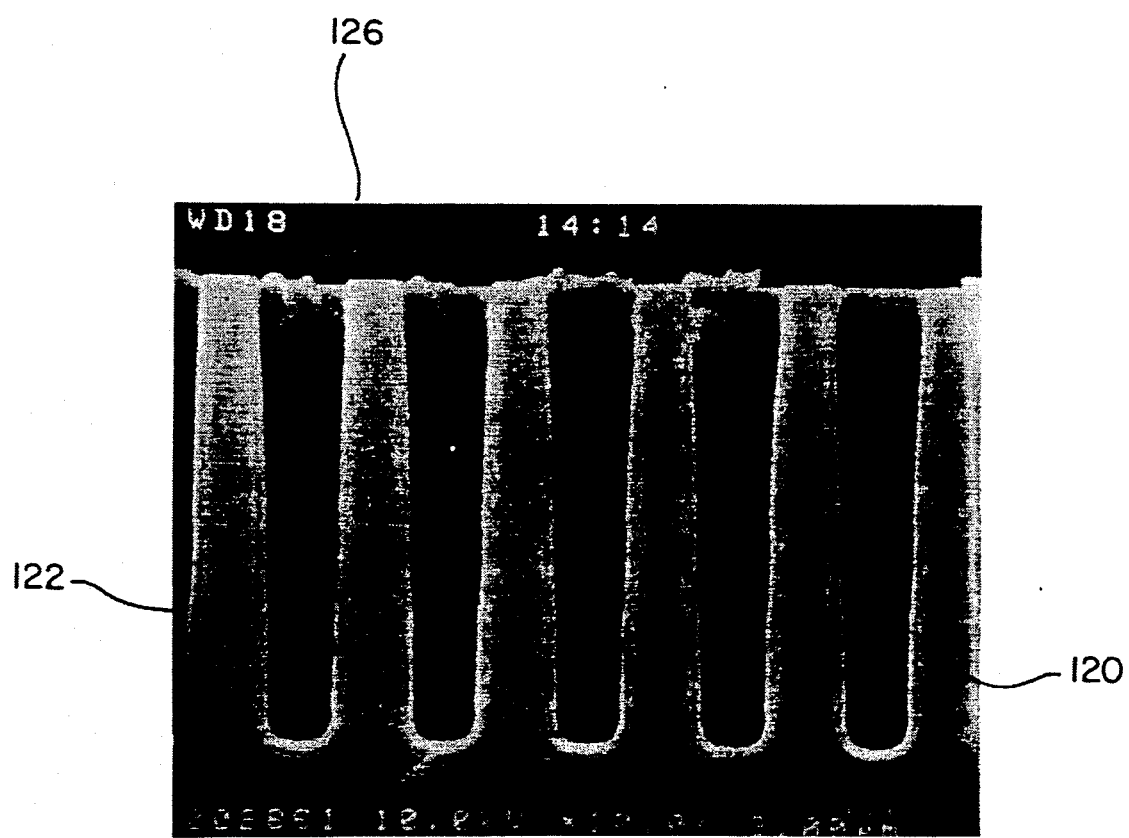
FIG. 3 is a scanning electron micrograph showing a trench, in a cross-sectional view, in a silicon wafer wherein the trench side wall has a thin heavily doped region formed by the methods of the present invention. The heavily doped region has been highlighted by a chemical etch.

Since the dopant technique according to the present invention is nondirectional, it can be used to dope the sidewall of a trench formed in the surface of a semiconducting wafer such as a silicon wafer. The doped layer lining the trench can be used to form a trench capacitor. A trench capacitor wherein the sidewalls of the trench are doped is difficult to obtain using ion implantation. FIG. 3 shows a scanning electron micrograph of a silicon wafer 120 with a trench 122 formed therein by conventional means. Using the process of the present invention there is formed around the periphery of trench 122 a highly doped region 126 at 1100° C. for 120 seconds having a thickness 128 of about 0.16 microns (see also FIG. 3).

The doped region has been highlighted by a chemical etch. A trench capacitor is useful in DRAM cell applications. After doping the sidewall of trench 122, a suitable dielectric (not shown in FIG. 3) can be deposited to coat the sidewall, for example, silicon dioxide and silicon nitride. The trench 122 can then be filled with polysilicon which can be subsequently doped using the method of the present invention. The polysilicon becomes one of the contacts to the trench capacitor.

There are advantages to depositing undoped silicon and doping afterwards. Doping during deposition decreases the conformality of the film compared to a highly conformal undoped polysilicon film. The technique could be applied by partially filling the trench with undoped polysilicon, exposing it to the arsine gas, and completing the fill with a second polysilicon deposition.

Besides the ability to form ultrashallow junctions (junctions of 50 nm are easily formed by AsH$_3$ annealing at temperatures around 900° C.) elimination of implant damage is an important feature of our doping technique. In both bipolar and MOS-based technologies, localized regions of stress (typically near trench and isolation regions) are known to cause otherwise benign implant damage to become large gliding dislocations that destroy or seriously degrade device function.

Figure 4:
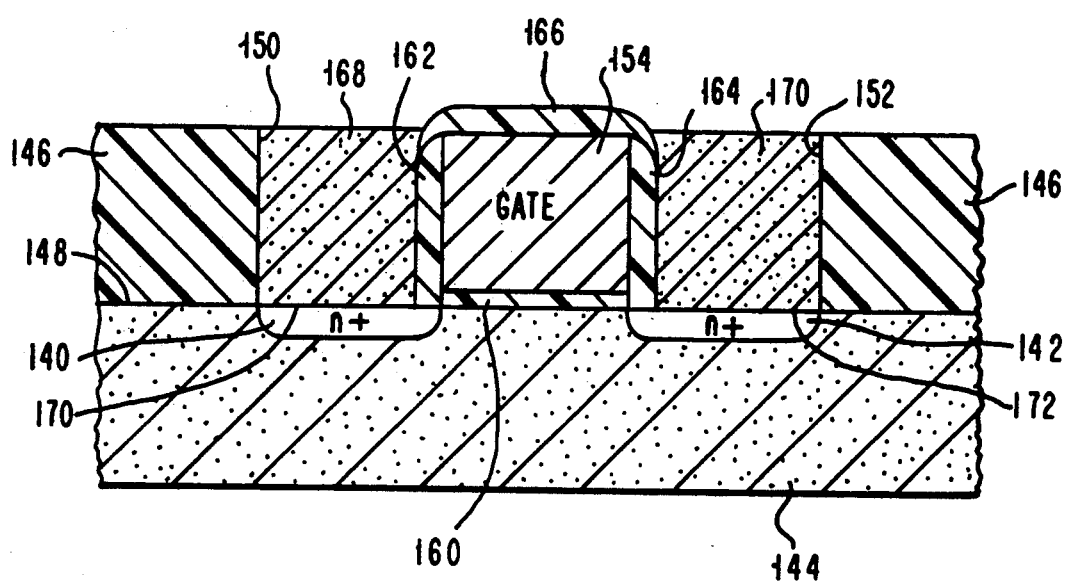
FIG. 4 shows a cross-sectional view of an FET device wherein the source and drain regions are formed by diffusing arsenic at high concentrations according to the present invention.

FIG. 4 shows a self-aligned FET transistor having source 140 and drain 142 formed in a silicon substrate 144. A dielectric layer 146 is deposited on surface 148 of silicon substrate 144. In dielectric layer 146 there is formed cavity 150 which is disposed over the source region 140 and cavity 152 which is disposed over the drain region 142. The region 154 between cavity 150 and 152 forms the gate of a FET transistor. In one variation, the cavity regions are exposed to arsine doping to form n+ drain regions of a silicon NMOS. In another variation cavities 150 and 154 are filled with polysilicon 168 and 170 respectively. The polysilicon is then doped according to the technique of the present invention. As diffuses readily through the polysilicon and then dopes the silicon regions 170 and 172 below the polysilicon regions 168 and 170, respectively, to form the source and drain regions 140 and 142, respectively. The doping of the polysiicon is so fast that there is no difference between the As profile in the single crystal silicon beneath the polysilicon and the arsenic profile of the single crystal silicon when there is no polysilicon thereover. Therefore, the profiles of the source and drain regions 140 and 142 respectively are essentially as shown in FIG. 2. The method according to the present invention avoids the implantation damage that accompanies typical high-dose source/drain implants. In addition, we have found that the doping techniques described herein produces lower resistance polysilicon compared to other doped polysilicon films. This allows the polysilcon plug, such as filling cavities 150 and 152, to have the potential to be scaled to a greater height before plug resistance becomes a problem.

The doping technique described herein is useful for DRAM chip fabrication and other MOS based device fabrication to form a shallow self-aligned junctions. In addition, the technique described herein can be applied to the formation of an emitter and buried subcollector in bipolar devices. (Bipolar devices which can be fabricated according to the present invention are described in U.S. patent application, Ser. No. 07/753,278, filed Aug. 30, 1991, the teaching of which is incorporated herein by reference.) Currently, some collectors are formed by high-dose arsenic implantation and subsequent epitaxial growth, but implantation damage must be completely removed before growing epitaxial layers. Presently, a long oxidation step at high temperature is performed to consume silicon beyond the damage region. This step could be completely avoided using the method described herein, because no damage is introduced into the silicon surface. The method described herein also allows a more controlled method to form emitters and subcollectors with the desired concentration level and spatial extent.

Single crystal silicon and intrinsic polysilicon layers have been doped using teriarybutylarsine (TBA) in an rapid thermal LPCVD (low pressure chemical vapor deposition) system. TBA offers an advantage over arsine gas with its lower acute toxicity. Doping experiments have been made with 100% TBA and also with mixtures as low as 10% TBA in Ar or H$_2$. SIMS dopant profiles of arsenic and single crystal silicon samples show concentrations greater than $2 \times 10^{20}$ As/cm$^3$ have been achieved. The sheet resistance measurements show value as low as 25 ohms per square.

Polysilicon layers on a thick dielectric layer were also doped using TBA. SIMS dopant profiles showed a uniform arsenic concentration at concentrations greater than $1 \times 10^{20}$ As/cm$^3$ are achievable for polysilicon layers as thick as 900 nm by diffusing at 1000° C. for 60 seconds. Sheet resistance measurements of polysilicon layers show values for 150 nanometer layers as low as 25 ohms per square. In addition, a DRAM deep trench was successfully doped by partially filling the trench with undoped polysilicon, exposing it to the TBA, and completing the fill with a second polysilicon deposition. A vertical SIMS profile shows uniform doping of approximately $1 \times 10^{20}$ As/cm$^3$ for a trench greater than 6 microns in depth.

In summary, the doping gas used for the diffusion method of the present invention has a relatively large concentration of the source of dopant arsenic, such as compared to the prior art. The arsenic containing gas concentration is greater than about 0.1 volume percent of the total volume of the carrier gas and the arsenic containing gas, whereas the prior art the volume concentration of the arsenic containing gas is about 0.01 volume percent of the total volume of the carrier gas and the arsenic containing gas. Moreover, by the method according to the present invention the pressure of the combination of the carrier gas and the arsenic containing gas is greater than about 0.1 Torr whereas in the prior art very low pressure of about $10^{-3}$ Torr is used. Moveover, the combination of the carrier gas and the arsenic containing gas contains a very low quantity of oxidizing agent such as water vapor or molecular oxygen. The oxidizing agent is less than about 1 part per million.

It is to be understood that the above described embodiments are simply illustrative of the principles of the invention. Various other modification and changes may be devised by those of skill in the art which will embody the principles of the invention and fall within the spirit and scope thereof.

We claim:

1. A method of doping a semiconductor surface with a single dopant species comprises the steps of:
   providing a gas containing an inert carrier gas and a dopant containing gas;
   said gas having a volume and a pressure;
   said dopant containing gas being greater than about 0.1% of said volume; and
   said pressure being greater than about 0.1 Torr;
   said gas having an oxidizing agent concentration of less than about 1 part per million; and
   exposing a semiconductor surface to said gas.

2. The method of claim 1, wherein said inert gas is selected from the group consisting of Ar, He, N$_2$ and H$_2$.

3. The method of claim 1, wherein said dopant containing gas is selected from the group consisting of arsine, tertiarybutylarsine, trimethylarsenic, triethylarsenic, phosphine, tertiarybutylphospine, trimethylphosphine, triethylphosphine and diborane.

4. The method of claim 1, wherein the peak concentration of said dopant is greater than about $3 \times 10^{19}$ atoms/cm$^3$.

5. The method of claim 1, wherein the depth of said dopant less than about 2,000 Angstroms.

6. The method of claim 1, wherein said semiconductor surface is silicon.

7. The method of claim 1, wherein said semiconductor surface is the surface of a cavity in a semiconductor body.

8. The method of claim 7, wherein said semiconductor body is selected from the group consisting of a semiconductor chip and a semiconductor wafer.

9. The method of claim 1, wherein said method forms the emitter of a bipolar transistor.

10. The method of claim 1, wherein said method forms the source of a FET transistor.

11. The method of claim 2, wherein said method forms the drain of a FET transistor.

12. The method of claim 1, further including polysilicon on said surface and wherein said surface is doped through said polysilicon.

13. The method of claim 1, wherein said surface is a surface of an intrinsic polysilicon layer and wherein said polysilicon layer is substantially uniformly doped.

14. The method of claim 1, wherein said oxidizing agent is selected from the group consisting of oxygen and water.

15. The method of claim 1, wherein said method forms the subcollector of a bipolar transistor.

16. The method of claim 1, wherein said said surface is a surface of a polysilicon layer and wherein said polysilicon is substantially uniformly doped.

17. The method of claim 4, wherein said surface is crystalline.

18. The method of claim 1, wherein said dopant species is an n-dopant.

19. The method of claim 1, wherein said dopant species is a p-dopant.

20. The method of claim 18, wherein said dopant species is arsenic.

21. The method of claim 18, wherein said dopant species is phosphorus.

22. The method of claim 19, wherein said dopant species is boron.

23. A method of singly doping a semiconductor surface with arsenic dopant at a peak dopant concentration of greater than about $3 \times 10^{19}$ atoms/cm$^3$ comprising:
   providing a gas containing inert carrier gas an an arsenic containing gas;
   said gas having a volume and a pressure;
   said arsenic containing gas being greater than about 0.1% of said volume; and
   said pressure being greater than about 0.1 Torr;
   said gas having an oxidizing agent concentration of less than about 1 part per million; and
   exposing a silicon surface to said gas.

24. The method of claim 18, wherein said arsenic containing gas is selected from the group consisting of arsine, tertiarybutylarsine, trimethylarsenic, triethylarsenic, phosphine, tertiarybutylphosphine, trimethylphosphine, triethylphosphine and diborane.

* * * * *